United States Patent [19]

Agahdel et al.

[11] Patent Number: 5,267,867

[45] Date of Patent: Dec. 7, 1993

[54] PACKAGE FOR MULTIPLE REMOVABLE INTEGRATED CIRCUITS

[75] Inventors: Fariborz Agahdel, San Jose; Chung Wen Ho, Monte Sereno, both of Calif.

[73] Assignee: Digital Equipment Corporation, Maynard, Mass.

[21] Appl. No.: 943,953

[22] Filed: Sep. 11, 1992

[51] Int. Cl.⁵ .................... H01R 13/00; H05K 7/10
[52] U.S. Cl. .................................................. 439/73
[58] Field of Search ............... 439/55, 66, 68, 67, 439/70, 72, 73, 77, 329, 330, 487, 525, 526; 361/386, 398, 383

[56] References Cited

U.S. PATENT DOCUMENTS

| | | | |
|---|---|---|---|
| 4,169,642 | 10/1979 | Mouissie | 439/68 X |
| 4,251,852 | 2/1981 | Ecker et al. | 361/398 |
| 4,517,624 | 5/1985 | Wessely | 361/387 |
| 4,521,829 | 6/1985 | Wessely | 361/387 |
| 4,597,617 | 7/1986 | Enochs | 339/17 CF |
| 4,783,719 | 11/1988 | Jamison et al. | 361/398 |
| 4,804,132 | 2/1989 | DiFrancesco | 228/115 |
| 4,812,191 | 3/1989 | Ho et al. | 156/239 |
| 4,830,623 | 5/1989 | Owens et al. | 439/71 X |
| 4,873,615 | 10/1989 | Grabbe | 361/398 X |
| 5,003,429 | 3/1991 | Baker et al. | 361/398 X |
| 5,053,922 | 10/1991 | Matta et al. | 361/386 |
| 5,065,280 | 11/1991 | Karnezos et al. | 361/386 |
| 5,083,697 | 1/1992 | DiFrancesco | 228/116 |

*Primary Examiner*—Timothy V. Eley
*Assistant Examiner*—Khan V. Nguyen
*Attorney, Agent, or Firm*—Albert P. Cefalo; Ronald C. Hudgens; James F. Thompson

[57] ABSTRACT

An integrated circuit package has multiple integrated circuits (ICs) mounted face down directly on one surface of a flexible circuit which is disposed in an opening of a rigid signal carrier, such as a pin grid array. The flexible circuit provides connections among the ICs, and also between the ICs and the signal carrier via wirebonds. The flexible circuit is attached to a rigid support ring that is bonded to the signal carrier adjacent to the opening. A thermally conductive lid covers the opening and contacts the backs of the ICs for heat removal. A rigid plate presses elastomeric pads against the other surface of the flexible circuit to maintain firm contact between the flexible circuit and the ICs and also between the ICs and the lid. The package may be hermetically sealed by attaching a cover to the support ring.

16 Claims, 3 Drawing Sheets

PACKAGE FOR MULTIPLE REMOVABLE INTEGRATED CIRCUITS

FIELD OF THE INVENTION

The invention relates to the field of integrated circuit packaging, and more particularly to packages for removably mounting multiple integrated circuits.

BACKGROUND OF THE INVENTION

In the electronics field, there is a trend toward ever-higher levels of integration or circuit density. This trend has several important benefits. For example, as more circuitry is put into integrated circuits (ICs), an electronic system can use fewer ICs, so that system cost is reduced. Also, as circuitry becomes smaller and more closely spaced, it is capable of running at higher speeds, so that system performance is improved.

However, along with these benefits come complications as well. Higher IC circuit density results in higher heat dissipation in the IC, so that better methods of heat removal must be employed to maintain the device at an acceptable operating temperature. Higher circuit density also results in more interconnections between ICs; and, to maintain high-speed operation, these interconnections must be short. Therefore, IC packages must make numerous reliable interconnections in as little space as possible. And the packages must be as simple and manufacturable as possible to minimize cost.

One particular packaging approach to achieve very high performance has been to removably mount multiple interconnected ICs together in a single package. Generally in such packages the bare ICs are connected by some means to a common substrate having electrical conductors interconnecting the ICs. In this approach, internal interconnections between ICs, such as the datapath in a central processing unit, are confined within the package. Such interconnections are therefore high speed and do not require package pins. These features increase the performance/cost ratio of the system. Also, since the ICs are removably mounted, they may be replaced easily for repair or design revision without risking destruction of the IC or its interconnect.

It is known to employ tape automated bonding, or TAB, to mount one or more ICs on a substrate. For example, a multi-chip package using TAB is shown in U.S. Pat. No. 5,065,280 issued Nov. 12, 1991 to Karnezos et al. In this system, TAB frames are bonded to ICs to connect them to a common flexible circuit substrate. The connection between the TAB frame and the flexible circuit is made either by soldering or by using an additional elastomeric element to compress them together.

Such a TAB system has several drawbacks. Separate manufacturing steps are required to attach the TAB frame to the IC. Also, the connection between the TAB frame and the flexible circuit is problematic: if it is soldered, the IC and TAB frame are not easily removable; if it is a direct connection, the package must have means to compress the TAB frame and flexible circuit together. Finally, the TAB frame can connect only to contact pads on the periphery of the IC, but future ICs will likely have contact pads in their interior area, known as area pads, in addition to peripheral pads. For these reasons and more, an improved multi-chip package is needed.

SUMMARY OF THE INVENTION

The invention is an improved integrated circuit package. In one sense, the invention is a package providing for heat dissipation and interconnection of multiple removable integrated circuits (ICs). In another sense, the invention is a package providing interconnection between removable ICs and a circuit board.

The package employs a multilayer flexible circuit having arrays of contact pads on its surface. Each array of contact pads matches the arrangement of the contact pads on a corresponding IC to be mounted directly on the flexible circuit. A thermally conductive lid is in contact with the backs of the ICs to provide for heat removal. A rigid plate holds elastomeric pads against the other side of the flexible circuit aligned with arrays of contact pads.

When the lid and plate are compressed, the elastomeric pads push all the ICs against the lid while the flexible circuit flexes to accommodate thickness variations among the ICs. This results in excellent heat dissipation. The elastomeric pads also force the flexible circuit to conform to the surface of each IC. Since the ICs are directly connected to the flexible circuit, the package is simpler and less expensive than a TAB package, and also is capable of interconnecting area contact pads as well as peripheral contact pads on the ICs.

Interconnection between the ICs and a circuit board is achieved by placing the flexible circuit in an opening in a signal carrier such as a pin grid array or quad flat pack. Contact pads located on the periphery of the flexible circuit are connected to a set of corresponding contacts on the signal carrier adjacent to the opening. A support ring may be attached to the signal carrier and the flexible circuit to provide support for the flexible circuit and the connections. The signal carrier can be attached to a circuit board by conventional means, such as soldering its leads to plated holes or landing pads on the circuit board.

To effect hermetic sealing, a cover is attached to the support ring. The plate, support ring, and cover act to seal the opening in the signal carrier so that the IC interconnection structure in the opening does not become contaminated.

BRIEF DESCRIPTION OF THE DRAWING

Embodiments of the invention will be described with reference to the accompanying drawing, in which.

DESCRIPTION OF THE EMBODIMENTS

Figure 1:
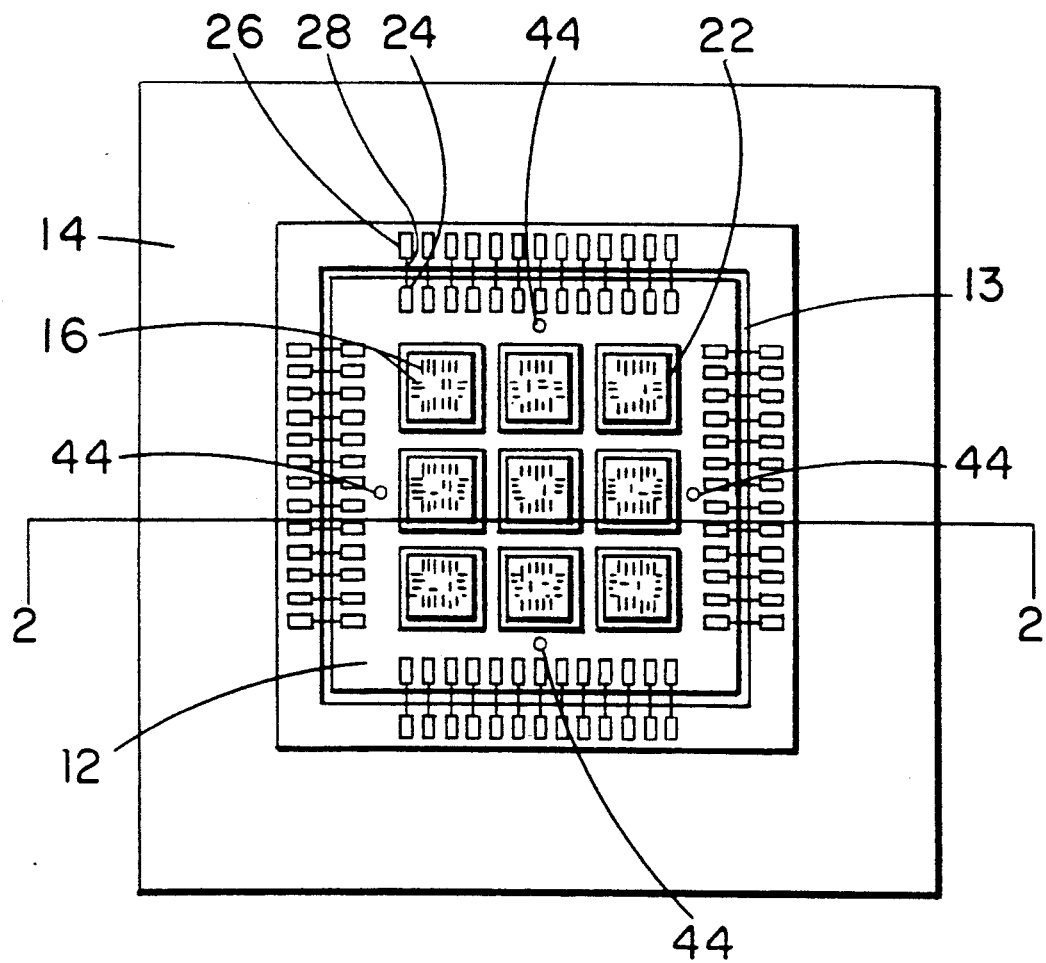
FIG. 1 is a top view of an integrated circuit package, according to the principles of the invention, with the lid removed and no integrated circuits mounted thereon.
Figure 2:
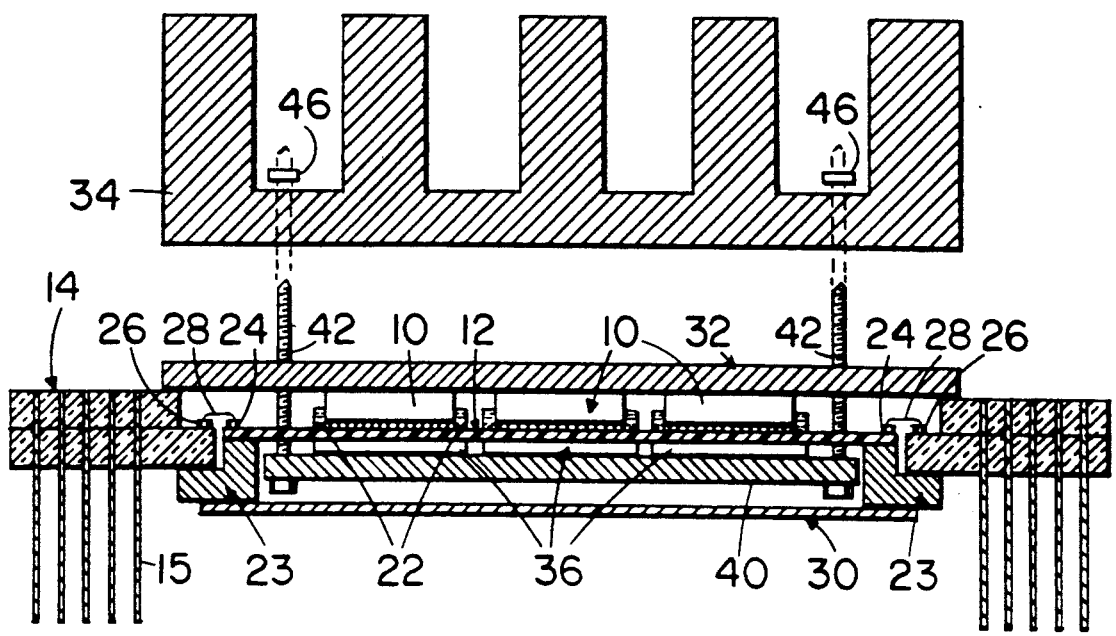
FIG. 2 is a section view the package of FIG. 1 along line 2—2.
Figure 2A:
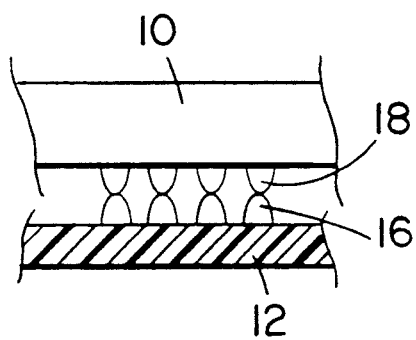
FIG. 2a is a detailed view of the connection between an integrated circuit and a flexible circuit in the package of FIG. 2.

FIGS. 1, 2, and 2a show an integrated circuit package in which a number of integrated circuits (ICs) 10 are mounted on a flexible circuit 12 disposed in an opening 13 of a rigid signal carrier 14, which as illustrated is a conventional ceramic pin grid array. The package may be connected in a conventional manner to a circuit board via pins 15.

The flexible circuit 12 achieves high interconnect density by having multiple conductor layers separated by layers of an insulative film of a polymer resin such as polyimide. It may be formed, for example, by the method of U.S. Pat. No. 4,812,191, entitled "Method of Forming a Multilevel Interconnection Device", issued Mar. 14, 1989 to Ho et al., assigned to Digital Equipment Corporation, and incorporated by reference herein. The ICs 10 are placed on the surface of the flexible circuit 12 in areas having corresponding arrays of electrical contact pads 16 that form direct connections with the contact pads 18 on the IC 10. The contact pads 18 can be located anywhere on the surfaces of the ICs 10.

Raised alignment templates 22 hold the ICs 10 such that the IC contact pads 18 are aligned with the flexible circuit contact pads 16. The alignment templates 22 are formed by etched photoresist, as shown in the U.S. patent application of Massingill et al., Ser. No. 07/720,262, filed Jun. 24, 1991, and incorporated by reference herein.

The connections between the IC contact pads 18 and the flexible circuit contact pads 16 can be created multiple ways. In one method, shown in FIG. 2a, the IC contact pads 18 and the flexible circuit contact pads 16 are gold plated bumps in surface contact with each other. Alternatively, particle-enhanced bonding of non plated contact pads, such as described in U.S. Pat. Nos. 4,804,132 and 5,083,697 both issued to DiFrancesco and incorporated herein by reference, may be used.

A rigid support ring 23 is attached to the signal carrier 14 adjacent to the opening 13, and the flexible circuit 12 is attached along its periphery to the support ring 23 by epoxy. The support ring 23 is preferably made of stainless steel. If the signal carrier 14 is made of ceramic, the support ring 23 can be attached by brazing; otherwise it may be epoxied. If hermetic sealing of the package is desired, the attachment must provide a gas tight seal. Although as illustrated the support ring 23, the flexible circuit 12 and the opening 13 in the signal carrier 14 are all square, other shapes such as circular may be advantageous in other embodiments.

Electrical contact pads 24 on the periphery of the flexible circuit 12 are connected to corresponding contact pads 26 on the signal carrier 14 by conventional wirebonds 28. This connection can be achieved in other ways, for example via a TAB frame. The support ring 23 provides support for the peripheral connections, and also helps to maintain the shape of the flexible circuit 12. A metallic cover 30 may optionally be brazed or otherwise sealingly attached to the support ring 23 if the package is to be hermetically sealed.

A lid 32 made of a thermally conductive material, such as copper or stainless steel, is attached to the signal carrier 14 spanning the opening 13. This attachment may also be by brazing or epoxy as appropriate, and must be gas tight if hermetic sealing is desired. The lid 32 has a planar bottom surface in contact with the backs of the ICs 10 to effect heat removal. Optionally a heat sink 34 may be placed against the lid 32 for improved heat removal. Alternatively, the lid 32 may itself be a heat sink, as long as its bottom surface provides sufficient contact area to effect adequate heat removal. A coating of a thermally conductive material such as thermogrease can be placed between the lid 32 and the ICs 10 to improve thermal performance.

Elastomeric pads 36 are disposed between the flexible circuit 12 and a rigid plate 40. The pads 36 are aligned with the areas of the flexible circuit 12 where the arrays of contact pads 16 are formed. The pads 36 may be epoxied to the plate 40 for ease of assembly. The pads 36 provide resilient means for transferring pressure from the plate 40 to the areas of the flexible circuit 12 where the arrays of contact pads 16 are formed. This pressure may also be transferred, for example, by a single pad spanning all of the ICs 10. Such a single pad embodiment may be easier to assemble. However, in the multiple pad embodiment shown in FIG. 2, the compression of each pad 36 is independent of adjacent pads 36, and so may better enable the flexible circuit 12 to conform to the ICs 10. This in turn may reduce the spacing between the ICs 10.

The pads 36 ideally maintain elasticity over a wide temperature range and are sufficiently soft and resilient to conform to the contact pads of the ICs 10. In the embodiment of FIG. 2, the pads 36 are made of a fiberglass reinforced silicone rubber designated by the American Materials Society as AMS 3320, and are 150 mils thick.

Screws 42 extend through holes 44 in the flexible circuit 12 and corresponding holes in the plate 40 and lid 32. The screws 42 are secured with nuts 46 to provide means for holding the plate 40 and the lid 32 together. As shown, the screws 42 may also extend through holes in the heat sink 34 to hold it in place. As the screws 42 are tightened, the entire stack consisting of the plate 40, pads 36, flexible circuit 12, ICs 10, and lid 32 is compressed. In particular, the flexible circuit 12 is pressed against the ICs 10, and the ICs 10 against the lid 32. This compression may alternatively be achieved, for example, by a clip or other mechanical fastener. However, screws are preferable for attaching the heat sink 34.

The pressing of the flexible circuit 12 against the ICs 10 achieves the connections between the flexible circuit 12 and the ICs 10. The flexible circuit 12 conforms to the shape of the surface of each IC 10, so that all the connections between the ICs 10 and the flexible circuit 12 are well made, despite normal non planarity of the contact pads on the ICs 10.

The pressing of the ICs 10 against the lid 32 achieves good heat removal because all of the ICs 10 are held firmly against a thermally conductive surface. The pads 36 and flexible circuit 12 cooperate to achieve this result. Each pad 36 presses its corresponding IC 10 against the lid 32, and the flexible circuit 12 flexes where necessary to accommodate ICs 10 having different thicknesses. Therefore, the package as shown does not need other features to compensate for normal variation in IC thickness. The pads 36 and flexible circuit 12 also compensate for non-planarity of the bottom surface of the lid 32.

Figure 2B:
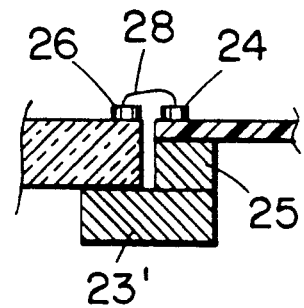
FIG. 2b is a section view of an alternative attachment between a flexible circuit and a signal carrier in the package of FIG. 2.

FIG. 2b shows an alternative way of attaching the flexible circuit 12 to the signal carrier 14. The support ring 23' is rectangular, in contrast to the L-shaped support ring 23 of FIG. 2. However, it is attached to the signal carrier 14 in the same way. A peripheral ring 25 is attached to the flexible circuit 12 and is epoxied to the support ring 23'. The peripheral ring 25 is a portion that remains after etching away the central portion of a metallic substrate which is utilized in the above referenced method of forming the flexible circuit 12. The peripheral ring 25 holding the flexible circuit 12 may be attached to the support ring 23' after the support ring 23' has been brazed to the signal carrier 14, so that the flexible circuit 12 is not damaged by the brazing process.

Figure 3:
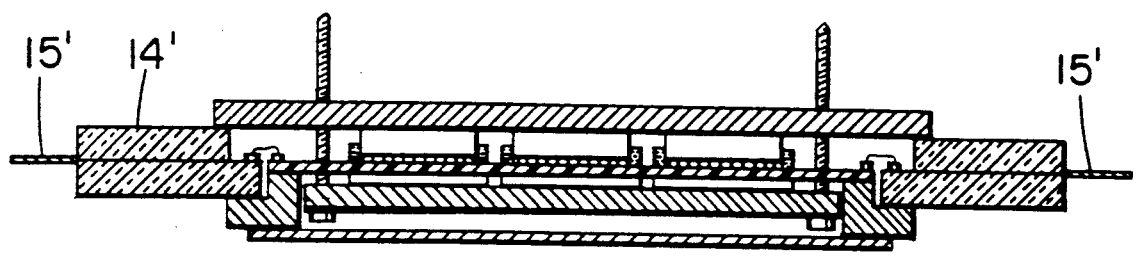
FIG. 3 is a section view of an integrated circuit package which is an alternative embodiment of the invention employing a quad flat pack signal carrier.

FIG. 3 shows a package similar to that of FIG. 2 except that the signal carrier 14' is a quad flat pack. As with a pin grid array, a quad flat pack can be connected to a circuit board in a conventional manner via leads 15' extending from the sides of the signal carrier 14'. It may be advantageous in some applications to use a quad flat pack rather than a pin grid array; other types of signal carriers may also be used. Although the integrated circuit package as described is particularly suitable for mounting multiple ICs, the principles of the invention may also be applied to packages holding only a single IC. There may also be other departures from the illustrated embodiments that fall within the scope of the invention as set forth in the following claims.

What is claimed is:

1. An integrated circuit package, comprising:
   a flexible circuit to provide interconnection among integrated circuits to be placed thereon;
   a thermally conductive lid to hold said integrated circuits against said flexible circuit;
   a rigid plate spaced apart from said lid such that said flexible circuit is between said lid and said plate;
   means, between said plate and said flexible circuit, for transferring pressure from said plate to the areas of said flexible circuit where said integrated circuits are to be placed;
   means for holding said plate and said lid together to maintain a pressing relationship among said lid, said integrated circuits, said flexible circuit, said pressure transferring means, and said plate;
   a signal carrier having (i) an opening in which said flexible circuit is disposed and across which said lid extends, and (ii) contact pads arranged around said opening and connected to peripheral contact pads on said flexible circuit to provide interconnection between said flexible circuit and a circuit board; and
   means attached to said flexible circuit and to said signal carrier for supporting said flexible circuit.

2. The package according to claim 1, wherein said signal carrier is made of a rigid material.

3. The package according to claim 2, wherein said signal carrier is a ceramic pin grid array.

4. The package according to claim 2, wherein said signal carrier is a quad flat pack.

5. The package according to claim 1, wherein said supporting means comprises a rigid support ring surrounding said opening and attached to the periphery of said flexible circuit.

6. An integrated circuit package, comprising:
   a signal carrier having an opening and contact pads arranged around said opening;
   a flexible circuit disposed within said opening having peripheral contact pads connected to said contact pads on said signal carrier, to provide interconnection between said signal carrier and an integrated circuit to be placed on said flexible circuit;
   means attached to said flexible circuit and to said signal carrier for supporting said flexible circuit;
   a rigid support ring surrounding said opening and attached to said signal carrier; and
   a rigid peripheral ring attached to the periphery of said flexible circuit and to said rigid support ring.

7. The package according to claim 6, wherein said peripheral contact pads on said flexible circuit are connected to said contact pads on said signal carrier by wirebonds.

8. An integrated circuit package, comprising:
   a signal carrier having an opening and contact pads arranged around said opening;
   a flexible circuit disposed within said opening having peripheral contact pads connected to said contact pads on said signal carrier, to provide interconnection between said signal carrier and an integrated circuit to be placed on said flexible circuit;
   means attached to said flexible circuit and to said signal carrier for supporting said flexible circuit;
   a thermally conductive lid spanning said opening to hold said integrated circuit against said flexible circuit;
   a rigid plate smaller than said opening spaced apart from said lid such that said flexible circuit is between said plate and said lid;
   an elastomeric pad disposed between said plate and said flexible circuit to transfer pressure from said plate to the area of said flexible circuit where said integrated circuit is to be placed; and
   means for holding said plate and said lid together to maintain a pressing relationship among said lid, said integrated circuit, said flexible circuit, said elastomeric pad, and said plate.

9. The package according to claim 8, wherein said lid is sealingly attached to said signal carrier, wherein said supporting means comprises a rigid support ring surrounding said opening attached to the periphery of said flexible circuit and sealingly attached to said signal carrier, and further comprising a cover sealingly attached to said support ring to hermetically seal said package.

10. An integrated circuit package, comprising:
    a rigid signal carrier having an opening and contact pads arranged around said opening;
    a rigid support ring attached to said signal carrier adjacent to said opening and extending into said opening;
    a flexible circuit disposed within said opening, attached along its periphery to said support ring, having peripheral contact pads forming wirebonded connections with said contact pads on said signal carrier, and having on a planar surface multiple arrays of contact pads to be in contact with contact pads on integrated circuits to be placed thereon;
    a thermally conductive flat lid to hold said integrated circuits against said flexible circuit;
    a rigid plate smaller than said opening spaced apart from said lid such that said flexible circuit is between said lid and said plate;
    multiple elastomeric pads disposed between said plate and said flexible circuit aligned with the areas of said flexible circuit where said integrated circuits are to be placed; and
    a plurality of screws holding said plate and said lid together.

11. The package according to claim 10, wherein said signal carrier is a ceramic pin grid array.

12. The package according to claim 10, wherein said signal carrier is a quad flat pack.

13. The package according to claim 10, wherein said support ring is stainless steel.

14. The package according to claim 10, wherein said lid is stainless steel.

15. The package according to claim 10, wherein said lid and said support ring are sealingly attached to said signal carrier, and further comprising a cover sealingly attached to said support ring to hermetically seal said package.

16. The package according to claim 10, further comprising alignment templates on said flexible circuit at the locations where said integrated circuits are to be placed, to hold said integrated circuits in precise alignment with said arrays of contact pads.

* * * * *